United States Patent
Rogers et al.

(10) Patent No.: US 10,867,822 B1
(45) Date of Patent: Dec. 15, 2020

(54) WAFER PRE-ALIGNMENT APPARATUS AND METHOD

(71) Applicant: Yaskawa America, Inc., Waukegan, IL (US)

(72) Inventors: John Charles Rogers, Danville, CA (US); Clark Thomas Tella, San Francisco, CA (US)

(73) Assignee: YASKAWA AMERICA, INC., Waukegan, IL (US)

(*) Notice: Subject to any disclaimer, the term of this patent is extended or adjusted under 35 U.S.C. 154(b) by 0 days.

(21) Appl. No.: 16/523,944

(22) Filed: Jul. 26, 2019

(51) Int. Cl.
*H01L 21/67* (2006.01)
*H01L 21/687* (2006.01)

(52) U.S. Cl.
CPC .. *H01L 21/67265* (2013.01); *H01L 21/68785* (2013.01)

(58) Field of Classification Search
CPC .................... H01L 21/67265; H01L 21/68785
See application file for complete search history.

(56) References Cited

U.S. PATENT DOCUMENTS

| | | |
|---|---|---|
| 3,930,684 A | 1/1976 | Lasch, Jr. et al. |
| 4,676,649 A | 6/1987 | Phillips |
| 5,238,354 A | 8/1993 | Volovich |
| 5,669,752 A | 9/1997 | Moon |
| 5,773,951 A | 6/1998 | Markowski et al. |
| 5,799,858 A | 9/1998 | Nam et al. |
| 6,340,281 B1 | 1/2002 | Haraguchi et al. |
| 6,370,793 B1 | 4/2002 | Chae et al. |
| 7,436,513 B2 | 10/2008 | Inenaga et al. |
| 7,796,238 B2 | 9/2010 | Kim |
| 10,254,661 B2 | 4/2019 | Liu et al. |
| 10,276,418 B2 | 4/2019 | Sun et al. |
| 2002/0097905 A1 | 7/2002 | Grau et al. |
| 2003/0178988 A1 | 9/2003 | Kim |
| 2007/0177120 A1 | 8/2007 | Kim |
| 2013/0273819 A1* | 10/2013 | Lu ................. H01L 21/68742 451/334 |

(Continued)

FOREIGN PATENT DOCUMENTS

WO    WO 1999/064207 A1    12/1999

OTHER PUBLICATIONS

International Search Report and Written Opinion of the International Searching Authority for corresponding International Application No. PCT/US2020/043656, dated Oct. 6, 2020.

*Primary Examiner* — Muhammad S Islam
(74) *Attorney, Agent, or Firm* — Mori & Ward, LLP

(57) ABSTRACT

An apparatus including a base, a drive device disposed on the base, a sensor unit disposed on the base, and an engagement device. The drive device having an output shaft with a wafer receiving surface, and the drive device being configured to rotate the output shaft about an axis of rotation. The sensor unit being configured to sense a wafer received on the wafer receiving surface. The engagement device being configured to engage and disengage a translational mechanism between the drive device and the sensor unit. When the engagement device engages the translational mechanism, rotation of the output shaft about the axis of rotation by the drive device changes a relative positional relationship between the sensor unit and the axis of rotation.

20 Claims, 13 Drawing Sheets

(56) References Cited

U.S. PATENT DOCUMENTS

| | | | |
|---|---|---|---|
| 2014/0071422 A1* | 3/2014 | Zhu | G03F 7/70725 355/72 |
| 2016/0329229 A1 | 11/2016 | Sun et al. | |
| 2018/0143541 A1 | 5/2018 | Liu et al. | |

* cited by examiner

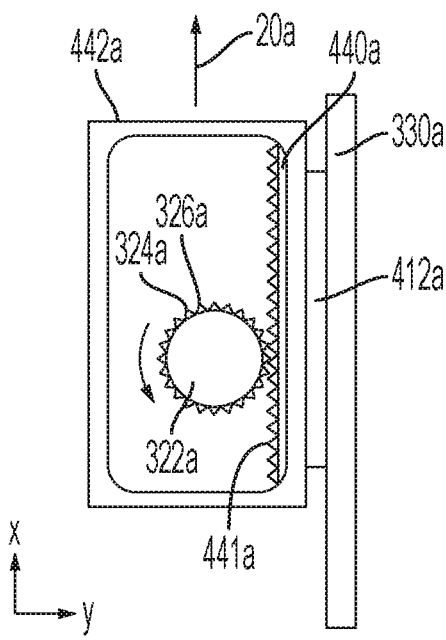
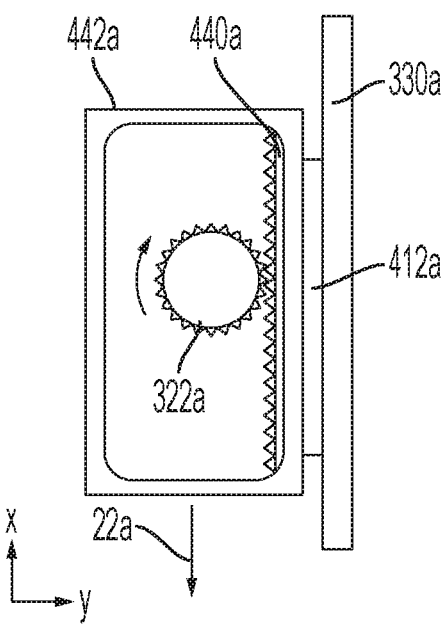
FIG. 8A    FIG. 8B
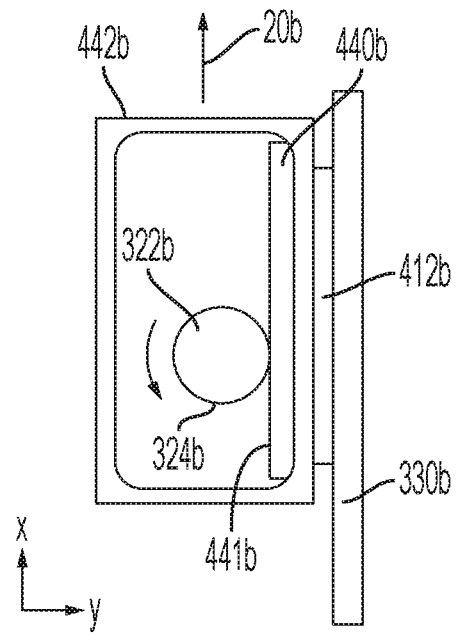
FIG. 9

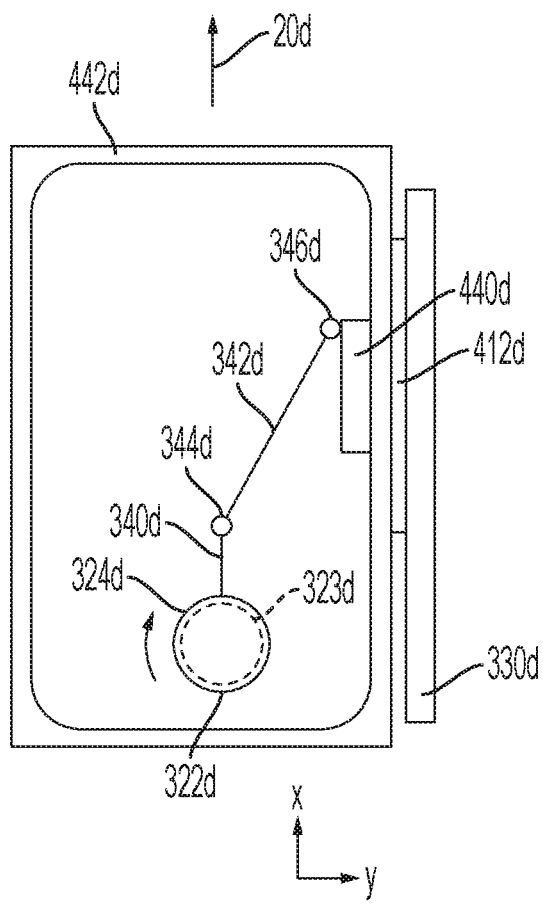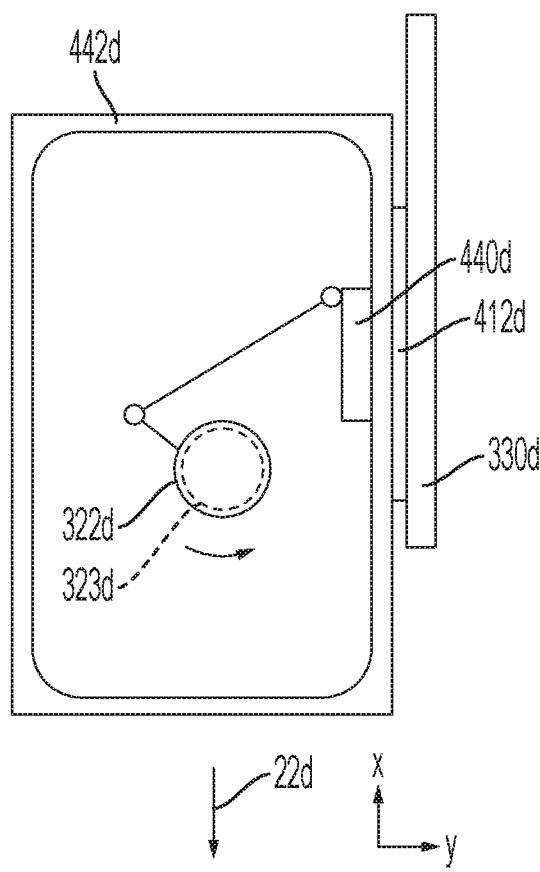
FIG. 11A
FIG. 11B

WAFER PRE-ALIGNMENT APPARATUS AND METHOD

BACKGROUND OF THE INVENTION

Field of the Invention

The present invention relates to semiconductor wafer processing.

Discussion of the Background

Prior to performing various processing operations on a semiconductor wafer, it may be necessary to determine the orientation of the semiconductor wafer. Some methods used to identify the orientation of the wafer can include providing a notch on a perimeter of the wafer, and utilizing a device to rotate the wafer such that the notch can be detected by a sensor in order to determine that the wafer is oriented at the desired orientation.

SUMMARY OF THE INVENTION

The present disclosure advantageously provides an apparatus comprising: a base; a drive device disposed on the base, the drive device having an output shaft with a wafer receiving surface, the drive device being configured to rotate the output shaft about an axis of rotation; a sensor unit disposed on the base, the sensor unit being configured to sense a wafer received on the wafer receiving surface; and an engagement device configured to engage and disengage a translational mechanism between the drive device and the sensor unit, wherein, when the engagement device engages the translational mechanism, rotation of the output shaft about the axis of rotation by the drive device changes a relative positional relationship between the sensor unit and the axis of rotation.

The present disclosure further advantageously provides an apparatus comprising: a base; a drive device disposed on the base, the drive device having an output shaft with a wafer receiving surface, the drive device being configured to rotate the output shaft about an axis of rotation; a sensor unit disposed on the base, the sensor unit being configured to sense a wafer received on the wafer receiving surface; a carriage slidably coupled the base, the sensor unit being mounted on the carriage; and an engagement device configured to engage and disengage a coupling between the drive device and the carriage, wherein, when the engagement device engages the coupling, rotation of the output shaft about the axis of rotation by the drive device changes a relative positional relationship between the sensor unit and the axis of rotation.

The present disclosure additionally advantageously provides a method comprising: providing an apparatus comprising: a base; a drive device disposed on the base, the drive device having an output shaft with a wafer receiving surface, the drive device being configured to rotate the output shaft about an axis of rotation; a sensor unit disposed on the base, the sensor unit being configured to sense a wafer received on the wafer receiving surface, and an engagement device configured to engage and disengage a translational mechanism between the drive device and the sensor unit; engaging the translational mechanism between the drive device and the sensor unit, and rotating the output shaft about the axis of rotation by the drive device to change a relative positional relationship between the sensor unit and the axis of rotation; and disengaging the translational mechanism between the drive device and the sensor unit, and rotating the output shaft about the axis of rotation by the drive device to rotate the wafer on the wafer receiving surface.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 8A is a bottom schematic view of a rotational member and a bottom plate of the wafer pre-alignment apparatus with the bottom plate in a first position, and FIG. 8B is a bottom schematic view of the rotational member and the bottom plate of FIG. 8A with the bottom plate in a second position;

FIG. 9 is a bottom schematic view of a rotational member and a bottom plate of a wafer pre-alignment apparatus according to an alternative embodiment;

FIG. 11A is a bottom schematic view of a rotational member and a bottom plate of a wafer pre-alignment apparatus according to a still further alternative embodiment with the bottom plate in a first position, and FIG. 11B is a bottom schematic view of the rotational member and the bottom plate of FIG. 11A with the bottom plate in a second position;

DETAILED DESCRIPTION OF EXEMPLARY EMBODIMENTS OF THE INVENTION

Figure 1:
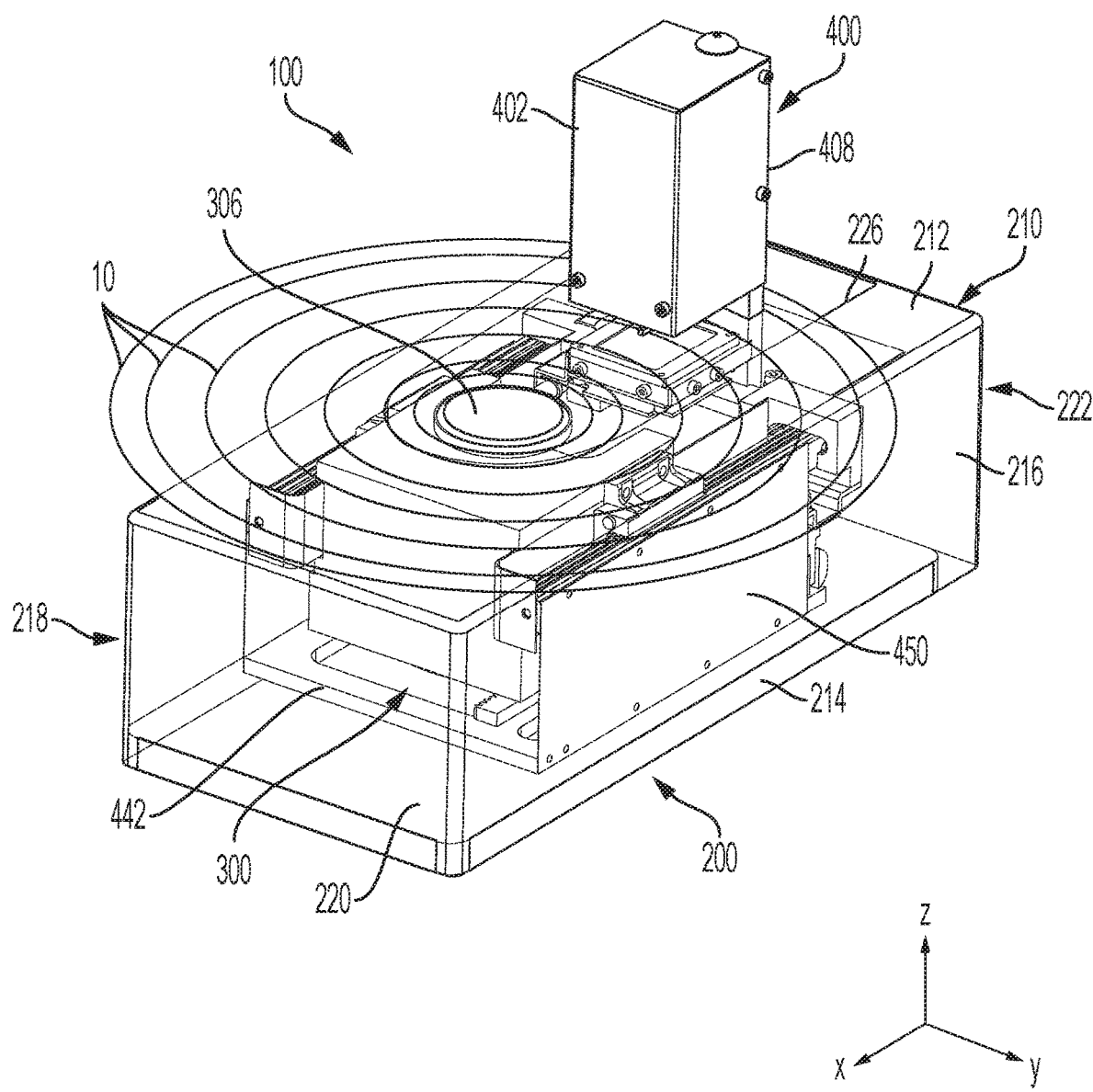
FIG. 1 is a top, front, left perspective view of a wafer pre-alignment apparatus according to an embodiment of the present invention.
Figure 2:
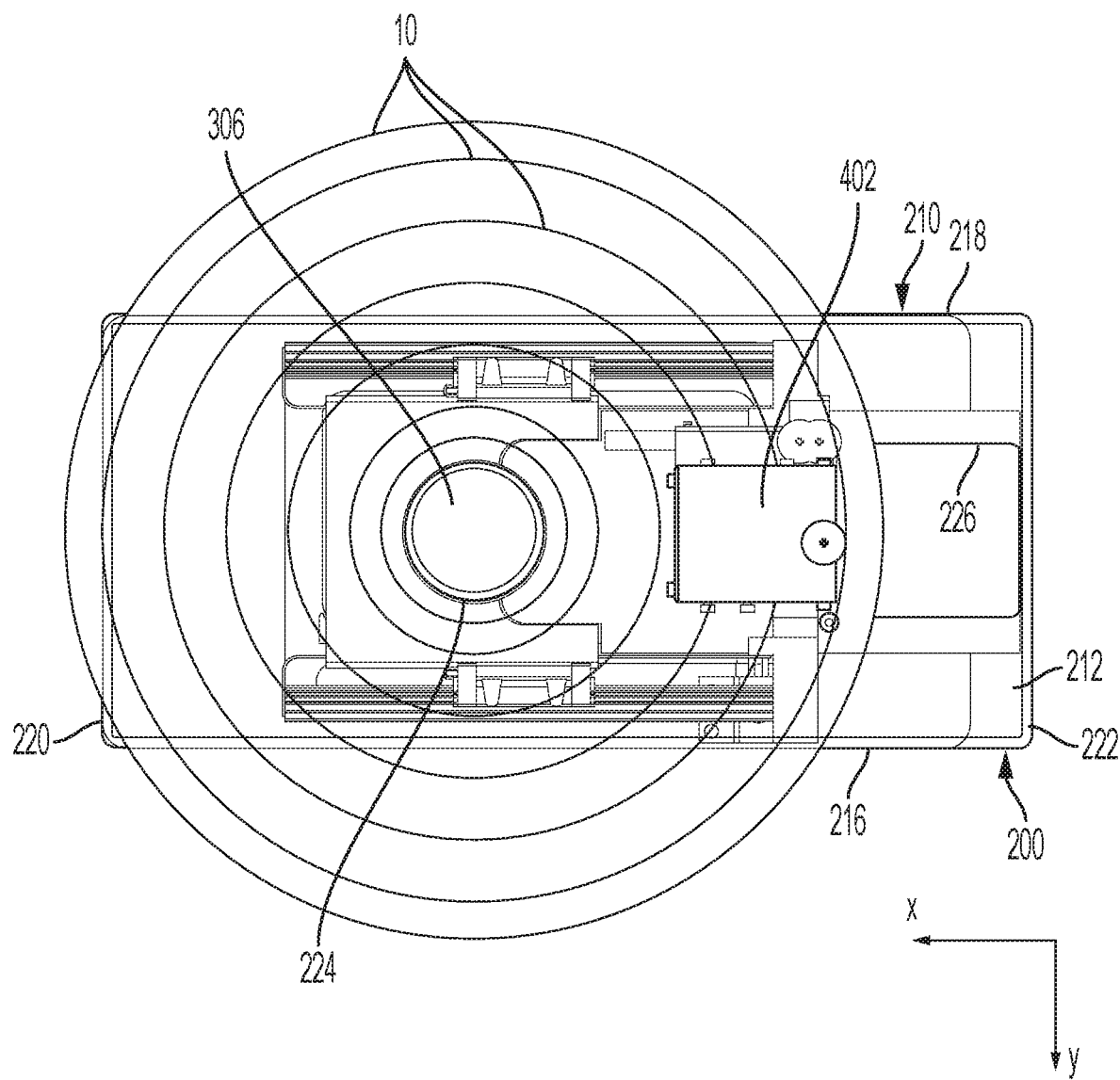
FIG. 2 is a top plan view of the wafer pre-alignment apparatus depicted in FIG. 1 with an outer housing depicted as transparent.
Figure 3:
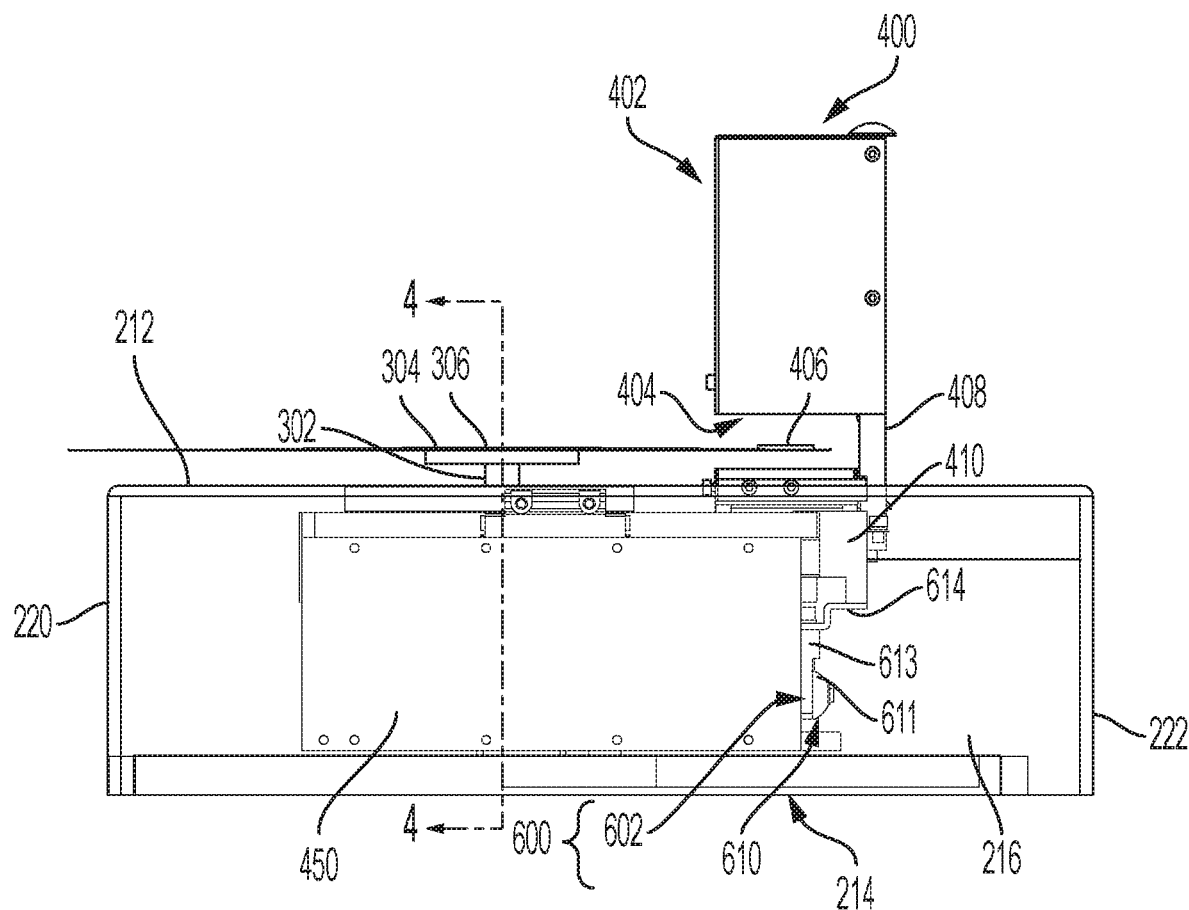
FIG. 3 is a front elevational view of the wafer pre-alignment apparatus depicted in FIG. 1 with the outer housing depicted as transparent.
Figure 4:
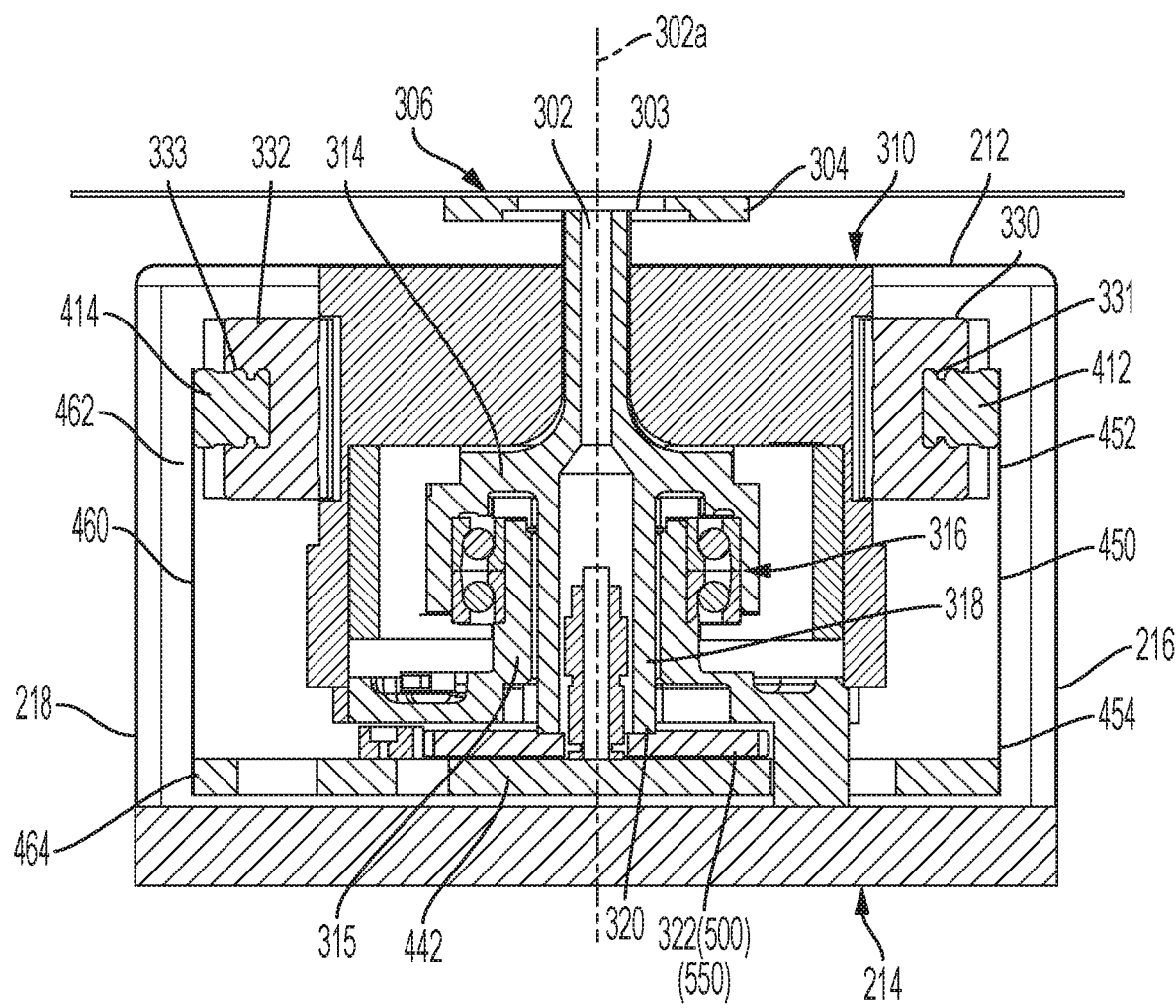
FIG. 4 is a cross-section view of the wafer pre-alignment apparatus taken along line 4-4 in FIG. 3.
Figure 5:
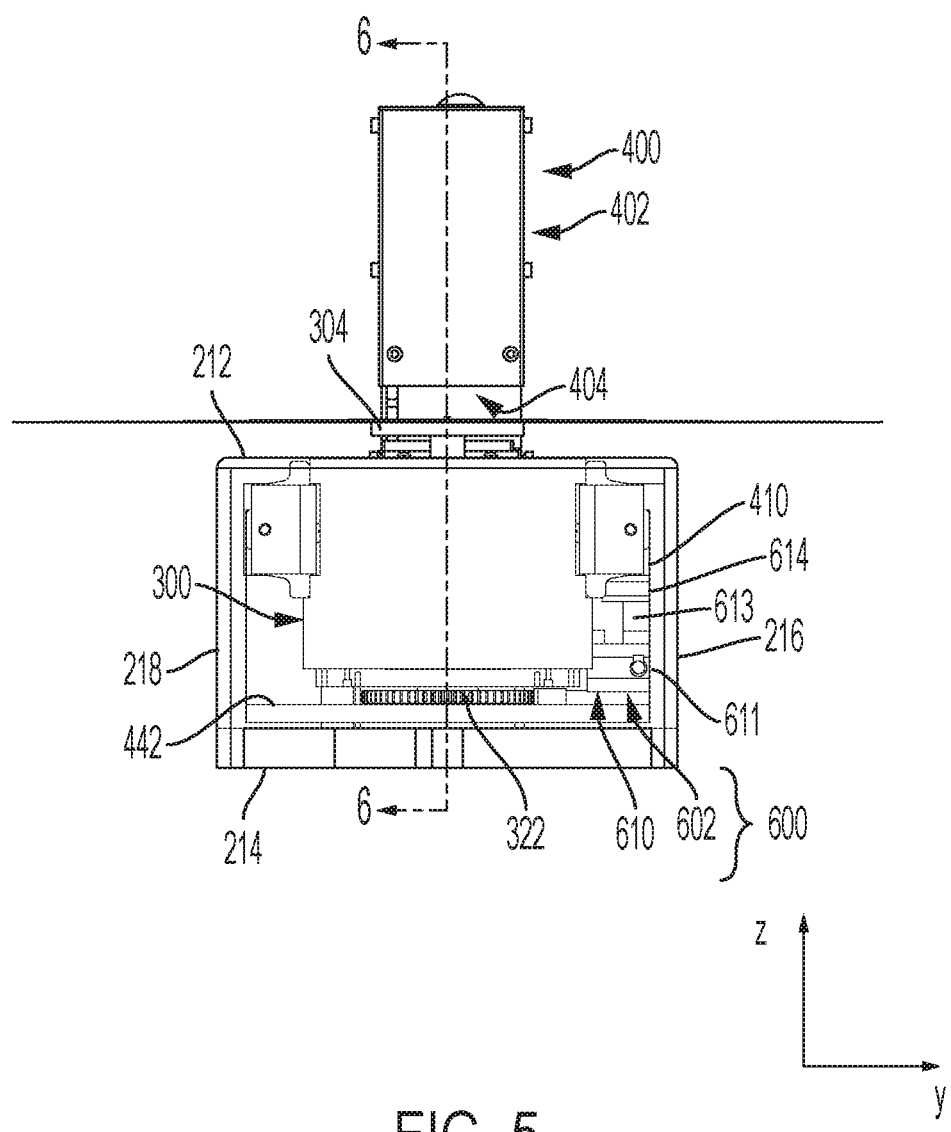
FIG. 5 is a left elevational view of the wafer pre-alignment apparatus depicted in FIG. 1 with the outer housing depicted as transparent.

Embodiments of the present invention will be described hereinafter with reference to the accompanying drawings. In the following description, the constituent elements having substantially the same function and arrangement are denoted by the same reference numerals, and repetitive descriptions will be made only when necessary.

A semiconductor wafer pre-alignment apparatus is described herein that advantageously accommodates various semiconductor wafer diameters.

Semiconductor wafers can be provided with a notch or marking that can be used to identify an orientation of the wafer, in order to ensure that the wafer is in a desired orientation for processing. For example, a single notch can be provided on a perimeter of the wafer. If a pre-alignment apparatus is provided with a wafer platform that supports and rotates the wafer, and a stationary read head that scans an edge of the wafer as it rotates, such an apparatus has distinct disadvantages. With such an apparatus, a range of a sensor of the read head may be only 20 mm, so the sensor must be positioned radially for different diameter wafers.

The semiconductor wafer pre-alignment apparatus described herein advantageously uses a same motor to both rotate the wafer and radially move the read head to allow for use with different sizes of wafers. In one embodiment of the apparatus, when the apparatus needs to radially move the read head, an actuator (such as an air cylinder or solenoid) drives a rack gear linearly towards a rotational gear. The rotational gear is rigidly affixed to the rotation motor. Once engaged, the motor can drive the rack and the read head to the appropriate radial position.

FIG. 1 depicts an apparatus 100 that can be used, for example, as a semiconductor wafer alignment apparatus to align a semiconductor wafer for inspection and/or for processing. The apparatus 100 can advantageously be used with semiconductor wafers having various diameters, as can be seen from concentric circles 10 shown in FIG. 1.

The apparatus 100 includes a base 200, a drive device 300, a sensor unit 400, and an engagement device 600.

The base 200 shown in FIG. 1 includes a housing (or outer housing) 210 including an upper wall 212, a lower wall 214, a first side wall 216, a second side wall 218, a third side wall 220, and a fourth side wall 222. The upper wall 212 includes an opening 224 for a portion of the drive device 300 to extend therethrough. The upper wall 212 further includes a slot 226 for a portion of the sensor unit 400 to extend therethrough. The slot 226 allows for relative movement between the sensor unit 400 and the drive device 300. The base 200 can either be mounted to a support in a stationary manner, for example, by fixing the base 200 with respect to a floor of a manufacturing facility, or in a movable manner, for example, by mounting the base 200 on a movable stage that can provide for movement with respect to the floor along one or more of an X axis, a Y axis, and a Z axis by using drive motors. The base 200 can be mounted by mounting the lower wall 214 to the support, or by mounting one of the other walls of the housing 210 to the support.

The drive device 300 is disposed on the base 200. The drive device 300 has an output shaft 302 with a wafer platform 304 mounted to a distal end 303 of the output shaft 302. The wafer platform 304 having a wafer receiving surface 306 that is configured to receive a semiconductor wafer. The wafer receiving surface 306 supports the wafer (see circles 10), and can be provided with a surface material that provides friction between the wafer and the wafer receiving surface 306 to prevent the wafer from moving in relation to the wafer receiving surface 306. Alternatively, or in addition to the surface material, the wafer receiving surface 306 can be provided with suction holes and the wafer platform 304 can be provided with a suction device to hold the wafer onto the wafer receiving surface 306 to prevent the wafer from moving in relation to the wafer receiving surface 306. The wafer platform 304 can be fixed to the distal end 303 of the output shaft 302 such that the wafer platform 304 does not rotate relative to the output shaft 302. Alternatively, the wafer platform 304 can be coupled to the distal end 303 such that the wafer platform 304 can selectively rotate relative to the output shaft 302 or not rotate relative to the output shaft 302, for example, using a clutch configured to engage and disengage transmission of rotation of the output shaft 302 to rotation of the wafer platform 304.

The drive device 300 is configured to rotate the output shaft 302 about an axis of rotation 302a. The drive device 300 can be, for example, an electric motor. The drive device 300 includes a housing 310 that is mounted to the housing 210. In the embodiment shown in FIGS. 1-4, the housing 310 is mounted in a stationary manner to the upper wall 212; however, the housing 310 could alternatively be mounted to another wall of the housing 210 of the base 200. The drive device 300 includes a stator 312 that is mounted in a fixed relationship to the housing 310, and a rotor 314 that rotates in relation to the stator 312. The rotor 314 is supported via bearings 316 by a rotational support 315 that is mounted in a fixed relationship to the housing 310. The output shaft 302 is part of or connected to the rotor 314 such that rotation of the rotor 314 results in rotation of the output shaft 302 about the axis of rotation 302a.

The output shaft 302 includes a lower portion 318 having a lower end 320. A rotational member 322 is coupled to the lower end 320 of the output shaft 302. The rotational member 322 can be fixed to the lower end 320 such that the rotational member 322 does not rotate relative to the output shaft 302. Alternatively, the rotational member 322 can be coupled to the lower end 320 such that the rotational member 322 can selectively rotate relative to the output shaft 302 or not rotate relative to the output shaft 302, for example, using a clutch configured to engage and disengage transmission of rotation of the output shaft 302 to rotation of the rotational member 322.

Figure 6:
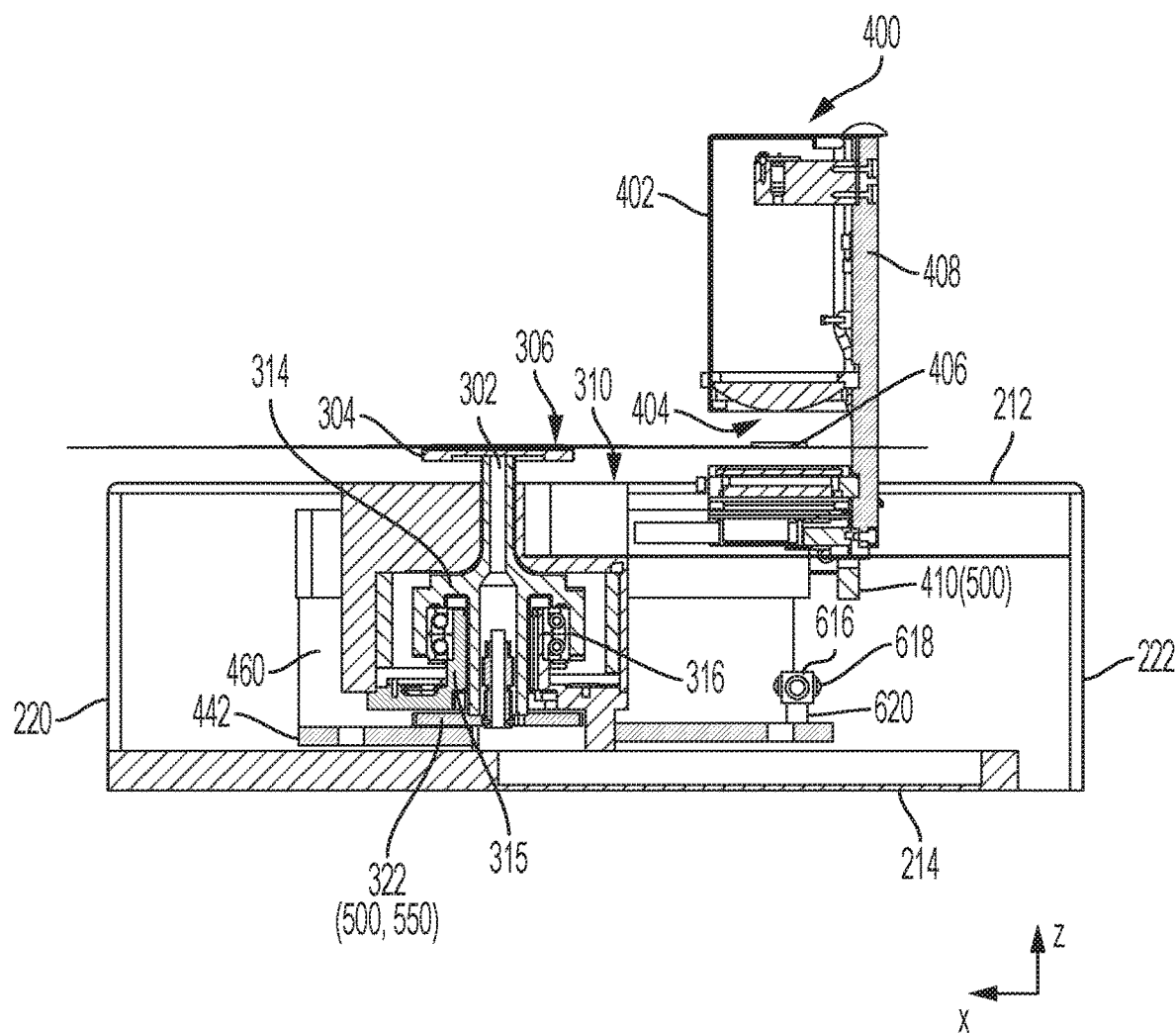
FIG. 6 is a cross-section view of the wafer pre-alignment apparatus taken along line 6-6 in FIG. 5.
Figure 7:
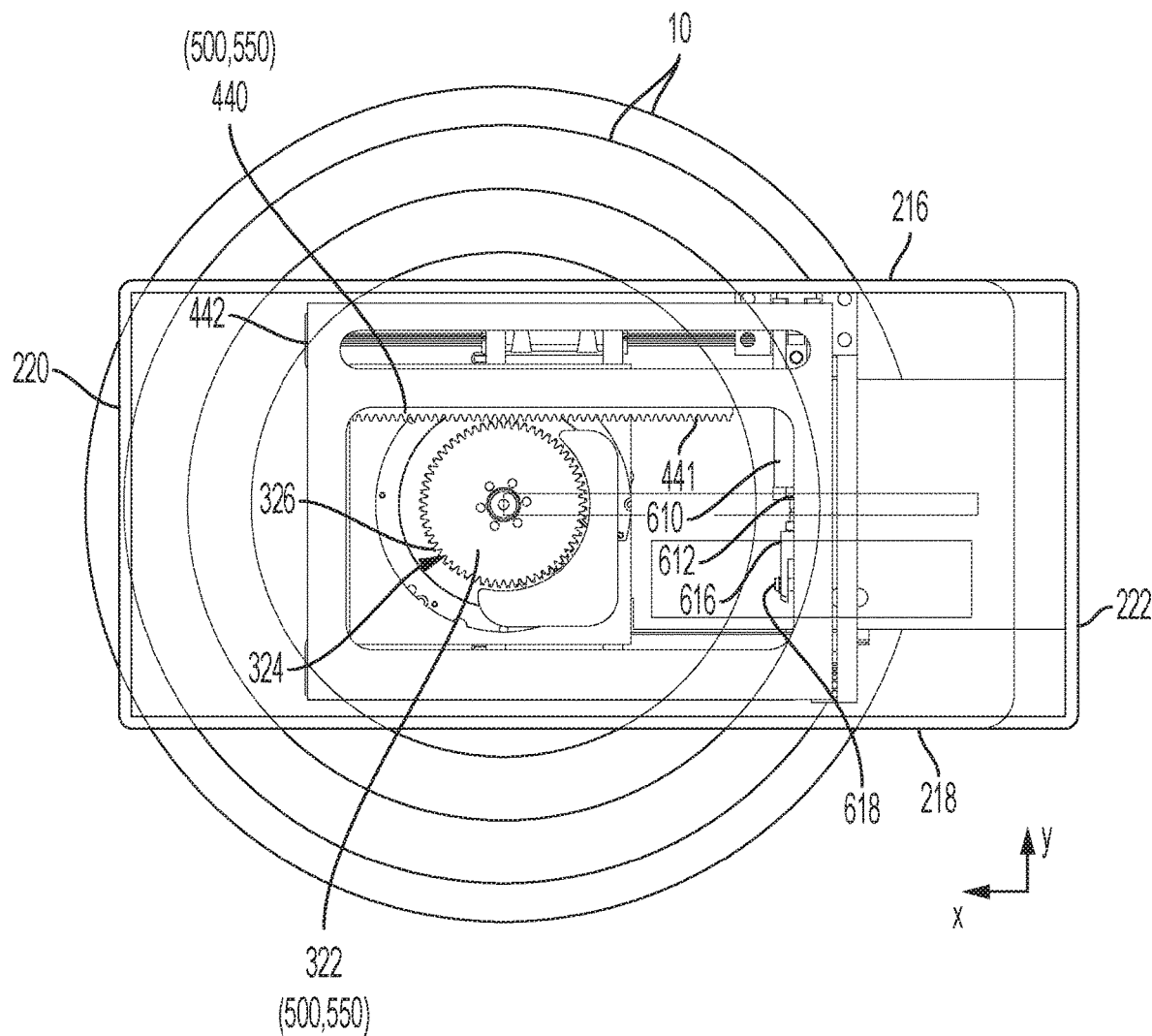
FIG. 7 is a bottom elevational view of the wafer pre-alignment apparatus depicted in FIG. 1 with the outer housing depicted as transparent.

The sensor unit 400 is disposed on the base 200. The sensor unit 400 being configured to sense a wafer received on the wafer receiving surface 306. The sensor unit 400 including a read head 402 having an optical sensor 404 facing in a −Z direction towards an upper surface of the wafer (see, e.g., FIGS. 3 and 6) that can sense the wafer, such as edges thereof or marks/notches formed thereon, within a sensing area 406 in order to align a semiconductor wafer for inspection and/or for processing. The read head 402 being mounted to a support member 408 that extends from within the housing 210 through the slot 226.

The apparatus 100 includes a translational mechanism 500 between the drive device 300 and the sensor unit 400. The translational mechanism 500 includes a carriage 410 that is slidably coupled the base 200, and the sensor unit 400 is mounted on the carriage 410 via the support member 406, which is mounted to the carriage 410. In the embodiment shown in FIGS. 1-7, the housing 310 of the drive device 300 is mounted to the housing 210 of the base 200, and first slide members 330 and 332 are mounted to opposing outer surfaces of the housing 310. Alternatively, the first slide members 330 and 332 could be directly mounted to walls of the housing 210. The carriage 410 includes second slide members 412 and 414 that are fixedly thereto. The second slide members 412 and 414 being slidably supported by the first slide members 330 and 332, respectively, to allow the carriage 410 to slide along the X axis. In the embodiment shown in FIGS. 1-7, the first slide members 330 and 332 have respective slots 331 and 333 that longitudinally extending along the X axis, and the second slide members 412 and 414 are slide rails that are provided within the slots 331 and 333, respectively; however, alternatively the second slide members 412 and 414 could be provided with slots that longitudinally extending along the X axis and the first slide members 330 and 332 could be slide rails that are provided within the slots.

The translational mechanism 500 further includes the rotational member 322 coupled to the output shaft 302, and a linear member 440 connected to the carriage 410. In the embodiment of FIGS. 1-7, the linear member 440 is a rack having a linear arrangement of teeth 441. The linear member 440 is mounted on a bottom plate 442, which is mounted to the second slide members 412 and 414 by flexures 450 and 460, respectively. Thus, the linear member 440 is connected to the carriage 410 via the bottom plate 442 and the flexures 450 and 460. Upper ends 452 and 462 of the flexures 450 and 460 are fixedly mounted to the second slide members 412 and 414, and lower ends 454 and 464 of the flexures 450 and 460 are fixedly mounted to opposite side of the bottom plate 442. The flexures 450 and 460 are flexible elements can bend when a cantilever force is applied to the lower ends 454 and 464 about the fixed upper ends 452 and 462. The carriage 410, the bottom plate 442, and the flexure members 450 and 460 form a four-bar linkage.

The engagement device 600 is configured to engage and disengage the translational mechanism 500 between the drive device 300 and the sensor unit 400 such that, when the engagement device 600 engages the translational mechanism, rotation of the output shaft 302 about the axis of rotation 302a by the drive device 300 changes a relative positional relationship between the sensor unit 400 and the axis of rotation 302a, and thus change a relative positional relationship between the sensor unit 400 and the wafer receiving surface 306. Also, when the engagement device 600 disengages the translational mechanism 500, rotation of the output shaft 302 about the axis of rotation 302a by the drive device 300 does not change the relative positional relationship between the sensor unit 400 and the axis of rotation 302a.

The engagement device 600 includes an actuator 602 configured to move the linear member 440 into contact with an outer circumferential surface 324 of the rotational member 322 to engage the linear member 440 to the rotational member 322. In the embodiment shown in FIGS. 1-7, the actuator 602 is configured to move the linear member 440 into contact with the outer circumferential surface 324 of the rotational member 322 to engage teeth 441 of the linear member 440 with teeth 326 on the outer circumferential surface 324 of the rotational member 322.

In the embodiment shown in FIGS. 1-7, the actuator 602 is an air cylinder 610 that upon actuation extends piston rod 612 along the Y axis. The actuator 600 could alternatively be a solenoid. When the air cylinder 610 is not actuated, then the piston rod 612 is retracted by an internal biasing member along the Y axis, such as a spring. The air cylinder 610 has a first end 611 with a support member 613 that connects the first end 611 to a bracket 614. The bracket 614 is mounted to the carriage 410 to maintain the first end 611 of the air cylinder in a fixed relationship with the carriage 410. The piston rod 612 has a coupling member 616 mounted to a terminal end thereof. The coupling member 616 extends and retracts along the Y axis with the movement of the piston rod 612. The coupling member 616 is coupled by a pin 618 to a connecting member 620 that is fixedly mounted to the bottom plate 442.

Actuation of the actuator 602 bends the flexure members 450 and 460 to move the linear member 440 into contact with the outer circumferential surface 324 of the rotational member 322 to engage the linear member 440 to the rotational member 322. Upon actuation of the actuator 602, the air cylinder 610 extends piston rod 612 along the Y axis, thereby moving the coupling member 616 along the Y axis, which pushes bottom plate 442 via the pin 618 and connecting member 620, thereby bending the flexure members 450 and 460 and moving the linear member 440 mounted to the bottom plate 442. Thus, actuation of the actuator 602 moves the linear member 440 from a disengaged position in which the teeth 441 of the linear member 440 are not engaged to the teeth 326 of the rotational member 322 to an engaged position in which the teeth 441 of the linear member 440 are engaged to (i.e., meshed with) the teeth 326 of the rotational member 322. Upon ceasing of the actuation of the actuator 602, the air cylinder 610 retracts piston rod 612 along the Y axis (e.g. by force of the internal biasing member), thereby moving the coupling member 616 along the Y axis, which pulls bottom plate 442 via the pin 618 and connecting member 620, thereby allowing the flexure members 450 and 460 to straighten and moving the linear member 440 mounted to the bottom plate 442. The ceasing of the actuation moves the linear member 440 from the engaged position in which the teeth 441 of the linear member 440 are engaged to (i.e., meshed with) the teeth 326 of the rotational member 322 to the disengaged position in which the teeth 441 of the linear member 440 are not engaged to the teeth 326 of the rotational member 322.

An amount of bending or deflection of the flexure members 450 and 460 can be determined, for example, based on a distance needed to move between an engaged state and a disengaged state of the teeth 441 and 326 (e.g. based on a height of the teeth 441 of the linear member 440 and a height of the teeth 326 of the rotational member 322) and a predetermined clearance distance. In an embodiment in which no teeth are present, but rather a frictional engagement is used, then an amount of bending or deflection of the flexure members 450 and 460 can be determined, for example, based on a predetermined clearance distance.

When the linear member 440 is engaged to the rotational member 322 (i.e., when the linear member 440 is in the engaged position in which the teeth 441 of the linear member 440 are engaged to the teeth 326 of the rotational member 322), then rotation of the output shaft 302 by the drive device 300 results in rotation of the rotational member 322, which results in the teeth 326 of the rotational member 322 driving the teeth 441 of the linear member 440 in a direction along the X axis. Thus, the linear member 440, the bottom plate 442, the flexures 450 and 460, and the carriage 410 are driven in the direction along the X axis such that the second slide members 412 and 414 slide along the first slide members 330 and 332, respectively, to allow the carriage 410 and the sensor unit 400 to slide in the direction along the X axis. Therefore, when the linear member 440 is engaged to the rotational member 322, the rotation of the output shaft 302 by the drive device 300 in clockwise and counterclockwise directions will result in translational movement of the sensor unit 400 along the X axis to change a relative positional relationship between the sensor unit 400 and the axis of rotation 302a by moving the sensor unit 400 closer to or farther away from the axis of rotation 302a, and thus change a relative positional relationship between the sensor unit 400 and the wafer receiving surface 306. The change in the relative positional relationship between the sensor unit 400 and the axis of rotation 302a allows for the apparatus 100 to be used with a variety of different diameter semiconductor wafers, such that the relative positional relationship between the sensor unit 400 and the axis of rotation 302a can be adjusted so that the sensing area 406 of the optical sensor 404 can be aligned with an outer edge area of the wafer. Thus, the sensor unit 400 and the axis of rotation 302a can be adjusted to be closer to each other for use with wafers of smaller diameter, and the sensor unit 400 and the axis of rotation 302a can be adjusted to be farther from each other for use with wafers of larger diameter.

Conversely, when the linear member 440 is disengaged from the rotational member 322 (i.e., when the linear member 440 is in the disengaged position in which the teeth 441 of the linear member 440 are not engaged to the teeth 326 of the rotational member 322), then rotation of the output shaft 302 by the drive device 300 will not result in the teeth 326 of the rotational member 322 driving the teeth 441 of the linear member 440 in a direction along the X axis. Therefore, when the linear member 440 is disengaged from the rotational member 322, the rotation of the output shaft 302 by the drive device 300 in clockwise and counterclockwise directions will not result in translational movement of the sensor unit 400 along the X axis and thus does not change the relative positional relationship between the sensor unit 400 and the axis of rotation 302a. Thus, when the linear member 440 is disengaged from the rotational member 322, the apparatus 100 can be used to perform alignment of the semiconductor wafer for inspection and/or for processing by using the drive device 300 to rotate the wafer and the optical sensor 404 to scan the wafer in the sensing area 406.

In the embodiment depicted in FIGS. 1-7, the engagement device 600 is configured to engage and disengage a coupling 550 between the drive device 300 and the carriage 410. The coupling 550 includes the rotational member 322 and the linear member 440. When the rotational member 322 and the linear member 440 are engaged (i.e., when the linear member 440 is in the engaged position in which the teeth 441 of the linear member 440 are engaged to the teeth 326 of the rotational member 322), then the drive device 300 and the carriage 410 are coupled together such that the rotation of the output shaft 302 by the drive device 300 in clockwise and counterclockwise directions will result in translational movement of the sensor unit 400 along the X axis to change a relative positional relationship between the sensor unit 400 and the axis of rotation 302a by moving the sensor unit 400 closer to or farther away from the axis of rotation 302a, and thus change a relative positional relationship between the sensor unit 400 and the wafer receiving surface 306. Conversely, when the linear member 440 is disengaged from the rotational member 322 (i.e., when the linear member 440 is in the disengaged position in which the teeth 441 of the linear member 440 are not engaged to the teeth 326 of the rotational member 322), then the drive device 300 and the carriage 410 are not coupled together such that the rotation of the output shaft 302 by the drive device 300 will not result in the teeth 326 of the rotational member 322 driving the teeth 441 of the linear member 440 in a direction along the X axis. Therefore, when the linear member 440 is disengaged from the rotational member 322, the rotation of the output shaft 302 by the drive device 300 in clockwise and counterclockwise directions will not result in translational movement of the sensor unit 400 along the X axis and thus does not change the relative positional relationship between the sensor unit 400 and the axis of rotation 302a.

In the same manner as in the embodiment of FIGS. 1-7, FIGS. 8A and 8B show an embodiment in which rotational member 322a is configured as a gear having an outer circumferential surface 324a with teeth 326a provided thereon. Additionally, linear member 440a is mounted on bottom plate 442a. The linear member 440a is configured as a rack having a linear arrangement of teeth 441a. FIGS. 8A and 8B show the linear member 440a engaged to the rotational member 322a (i.e., the linear member 440a is in the engaged position in which the teeth 441a of the linear member 440a are engaged to the teeth 326a of the rotational member 322a). Therefore, in this engaged state, rotation of the rotational member 322a in the counterclockwise direction (as shown in FIG. 8A) will result in translational movement of the bottom plate 442a (as well as the connected carriage and sensor unit) along the X axis in a first direction 20a by sliding second sliding member 412a along first sliding member 330a. (For simplicity of the drawings, only one first sliding member and one second sliding member are shown in FIGS. 8A and 8B; however, additional first and second sliding members can be included to provide stability to the sliding motion.) Furthermore, in this engaged state, rotation of the rotational member 322a in the clockwise direction (as shown in FIG. 8B) will result in translational movement of the bottom plate 442a (as well as the connected carriage and sensor unit) along the X axis in a second direction 22a, which is opposite to the first direction 20a, by sliding second sliding member 412a along first sliding member 330a.

FIGS. 9-12 show alternative embodiments of the invention.

FIG. 9 show an embodiment in which rotational member 322b is has an outer circumferential surface 324b that is frictionally engageable with a surface 441b of the linear member 440b. The outer circumferential surface 324b and/or the surface 441b can provided with surface material that provides friction between these surface when these surfaces are in contact with one another in order to prevent these surfaces from slipping in relation to one another when the rotational member 322b is rotated. FIG. 9 shows the linear member 440b engaged to the rotational member 322b (i.e., the outer circumferential surface 324b is in contact with the surface 441b). Therefore, in this engaged state, rotation of the rotational member 322b in the counterclockwise direction (as shown in FIG. 9) will result in translational movement of the bottom plate 442b (as well as the connected carriage and sensor unit) along the X axis in a first direction 20b by sliding second sliding member 412b along first sliding member 330b. (For simplicity of the drawing, only one first sliding member and one second sliding member are shown in FIG. 9; however, additional first and second sliding members can be included to provide stability to the sliding motion.) Furthermore, in this engaged state, rotation of the rotational member 322b in the clockwise direction will result in translational movement of the bottom plate 442b (as well as the connected carriage and sensor unit) along the X axis in a second direction opposite to the first direction 20b, by sliding second sliding member 412b along first sliding member 330b.

Figure 10A:
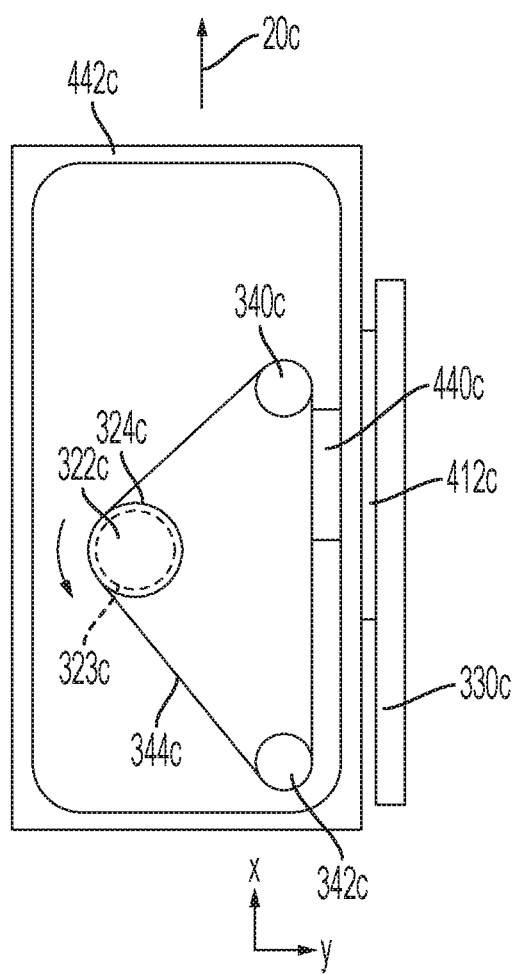
FIG. 10A is a bottom schematic view of a rotational member and a bottom plate of a wafer pre-alignment apparatus according to a further alternative embodiment with the bottom plate in a first position.
Figure 10B:
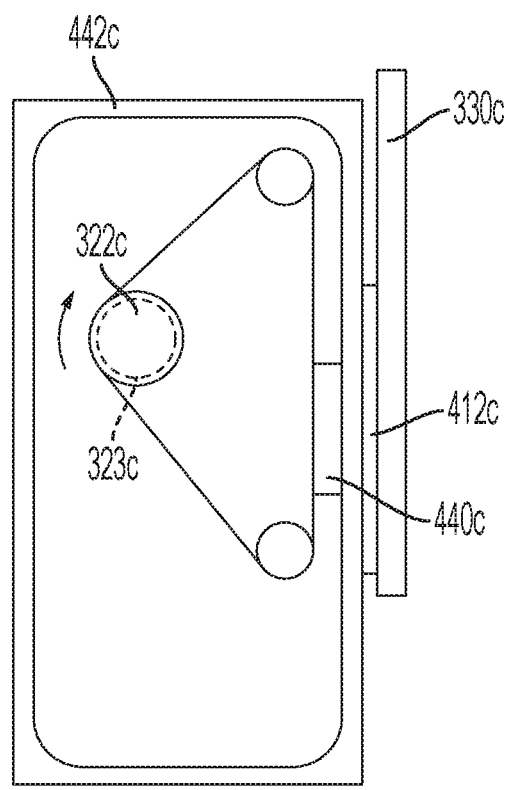
FIG. 10B is a bottom schematic view of the rotational member and the bottom plate of FIG. 10A with the bottom plate in a second position.

FIGS. 10A and 10B show an embodiment in which rotational member 322c is provided with a belt and pulley arrangement to transfer rotation of the rotational member 322c to translation of the sensor unit. Thus, the drive device includes pulleys 340c and 342c rotatably mounted to the housing of the drive device. The rotational member 322c has an outer circumferential surface 324c that drives a belt 344c about pulleys 340c and 342c. The belt 344c is fixed to member 440c, which is mounted on bottom plate 442c. In this embodiment, a clutch 323c is provided at the juncture between a lower end of the output shaft of the drive device and the rotational member 322c. The clutch 323c is configured to engage and disengage power transmission from the rotation of the output shaft to the rotation of the rotational member 322c. FIGS. 10A and 10B show the member 440c engaged to the rotational member 322c due to an engaged state of the clutch 323c and presence of the belt 344c. Therefore, in this engaged state, rotation of the rotational member 322c in the counterclockwise direction (as shown in FIG. 10A) will result in translational movement of the bottom plate 442c (as well as the connected carriage and sensor unit) along the X axis in a first direction 20c by sliding second sliding member 412c along first sliding member 330c. (For simplicity of the drawings, only one first sliding member and one second sliding member are shown in FIGS. 10A and 10B; however, additional first and second sliding members can be included to provide stability to the sliding motion.) Furthermore, in this engaged state, rotation of the rotational member 322c in the clockwise direction (as shown in FIG. 10B) will result in translational movement of the bottom plate 442c (as well as the connected carriage and sensor unit) along the X axis in a second direction 22c, which is opposite to the first direction 20c, by sliding second sliding member 412c along first sliding member 330c.

The clutch described above and below can be any conventional clutch that allows for engagement and disengagement of power transmission from the rotation of the output shaft to the rotation of the rotational member. It is noted that a clutch, such as is described above with respect to FIGS. 10A and 10B, could be incorporated into any of the embodiments shown in FIGS. 1-9 as the engagement device 600, thereby eliminating the need for actuator 602 and eliminating the need for movement of the bottom plate in the direction of the Y axis. Thus, the rotational member and the linear member can remain in an engaged state, and the clutch can be used to engage or disengage power transmission from the rotation of the output shaft to the rotation of the rotational member and thus engage or disengage power transmission of the output shaft from rotating the rotational member and thus driving the movement of the linear member. Additionally, in such a configuration, the flexures could be made of a more rigid material.

FIGS. 11A and 11B show an embodiment in which rotational member 322d is provided with a member 340d fixedly connected to the rotational member 322d. The member 340d can extend from an outer circumferential surface 424d of the rotational member 322d as shown or can be provided on an outer edge of the rotational member 322d at a location spaced apart from the axis of rotation of the rotational member 322d. The member 340d is pivotally connected to an arm member 342d by a first pivot joint 344d. The arm member 342d is pivotally connected to member 440d by a second pivot joint 346d to provide a linkage between the rotational member 322d and the member 440d. The member 440d is mounted on bottom plate 442d. In this embodiment, a clutch 323d is provided at the juncture between a lower end of the output shaft of the drive device and the rotational member 322d. The clutch 323d is configured to engage and disengage power transmission from the rotation of the output shaft to the rotation of the rotational member 322d. FIGS. 11A and 11B show the member 440d engaged to the rotational member 322d due to an engaged state of the clutch 323d and presence of the linkage including arm member 342d. Therefore, in this engaged state, rotation of the rotational member 322d in the clockwise direction (as shown in FIG. 11A) will result in translational movement of the bottom plate 442d (as well as the connected carriage and sensor unit) along the X axis in a first direction 20d by sliding second sliding member 412d along first sliding member 330d. (For simplicity of the drawings, only one first sliding member and one second sliding member are shown in FIGS. 11A and 11B; however, additional first and second sliding members can be included to provide stability to the sliding motion.) Furthermore, in this engaged state, rotation of the rotational member 322d in the counterclockwise direction (as shown in FIG. 11B) will result in translational movement of the bottom plate 442d (as well as the connected carriage and sensor unit) along the X axis in a second direction 22d, which is opposite to the first direction 20d, by sliding second sliding member 412d along first sliding member 330d.

Figure 12:
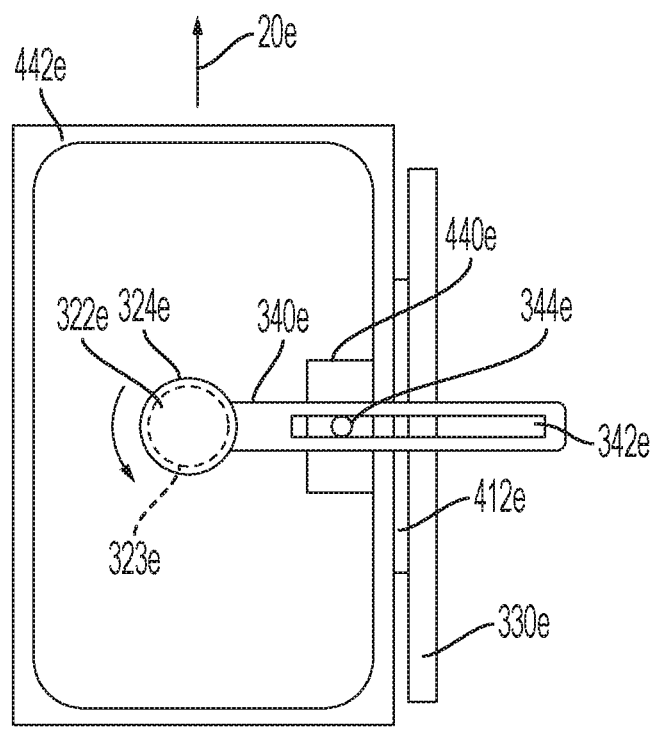
FIG. 12 is a bottom schematic view of a rotational member and a bottom plate of a wafer pre-alignment apparatus according to another further alternative embodiment.

FIG. 12 shows an embodiment in which rotational member 322e is provided with a drive arm 340e fixedly connected to the rotational member 322e and extending from an outer circumferential surface 424e of the rotational member 322e. The drive arm 340e having an elongated shape with a cam slot 342e extending longitudinally along the drive arm 340e. A cam follower 344e is fixedly mounted on member 440e. The member 440e is mounted on bottom plate 442e which is connected to the carriage via the flexures. The cam follower 344e disposed within the cam slot 342e such that pivoting motion of the drive arm 340e due to rotation of the rotational member 322e cause the cam follower 344e to be driven in the X axis direction by the cam slot 342e. In this embodiment, a clutch 323e is provided at the juncture between a lower end of the output shaft of the drive device and the rotational member 322e. The clutch 323e is configured to engage and disengage power transmission from the rotation of the output shaft to the rotation of the rotational member 322e. FIG. 12 shows the member 440e engaged to the rotational member 322e due to an engaged state of the clutch 323e and presence of drive arm 340e, cam slot 342e and cam follower 344e. Therefore, in this engaged state, rotation of the rotational member 322e in the counterclockwise direction (as shown in FIG. 12) will result in translational movement of the bottom plate 442e (as well as the connected carriage and sensor unit) along the X axis in a first direction 20e by sliding second sliding member 412e along first sliding member 330e. (For simplicity of the drawing, only one first sliding member and one second sliding member are shown in FIG. 12; however, additional first and second sliding members can be included to provide stability to the sliding motion.) Furthermore, in this engaged state, rotation of the rotational member 322e in the clockwise direction will result in translational movement of the bottom plate 442e (as well as the connected carriage and sensor unit) along the X axis in a second direction opposite to the first direction 20e, by sliding second sliding member 412e along first sliding member 330e.

The apparatus of the present invention advantageously provides a drive device that can be used both to rotate a semiconductor wafer about an axis of rotation and to adjust a positional relationship between a sensor unit and the axis of rotation. The adjustment of the positional relationship between the sensor unit and the axis of rotation advantageously allows the apparatus to be used with various sizes of semiconductor wafers with a wide range of diameters.

With respect to the embodiment shown in FIGS. 1-7, the apparatus 100 can be utilized, for example, by placing a semiconductor wafer on the wafer receiving surface 306 of the wafer platform 304, engaging the engagement device 600 by actuating actuator 602 to bend flexures 450 and 460 to engage teeth 441 with teeth 326, actuate the drive device 300 to rotate the output shaft 302 and the rotational member 322 in order to drive the carriage 410 and sensor unit 400 in a direction along the X axis toward the axis of rotation 302a, and utilize the optical sensor 404 to detect the presence or absence of the semiconductor wafer in the sensing area 406. Once the optical sensor 404 detects the presence of an edge of the semiconductor wafer move within the sensing area 406, then the drive device 330 and/or the engagement device 600 can be deactivated to stop the movement of the carriage 410 and sensor unit 400 in the direction along the X axis toward the axis of rotation 302a. Once the optical sensor 404 is at a desired position with respect to the semiconductor wafer on the wafer receiving surface 306, then the apparatus 100 can be used to perform alignment of the semiconductor wafer for inspection and/or for processing by using the drive device 300 to rotate the wafer and the optical sensor 404 to scan the wafer in the sensing area 406.

The apparatus 100 advantageously allows for adjustment of the relative positional relationship between the sensor unit 400 and the axis of rotation 302 using a same drive device used to rotate the semiconductor wafer about the axis of rotation. The change in the relative positional relationship between the sensor unit 400 and the axis of rotation 302a allows for the apparatus 100 to be used with a variety of different diameter semiconductor wafers, such that the relative positional relationship between the sensor unit 400 and the axis of rotation 302a can be adjusted so that the sensing area 406 of the optical sensor 404 can be aligned with an outer edge area of the wafer. Thus, the sensor unit 400 and the axis of rotation 302a can be adjusted to be closer to each other for use with wafers of smaller diameter, and the sensor unit 400 and the axis of rotation 302a can be adjusted to be farther from each other for use with wafers of larger diameter.

Figure 13:
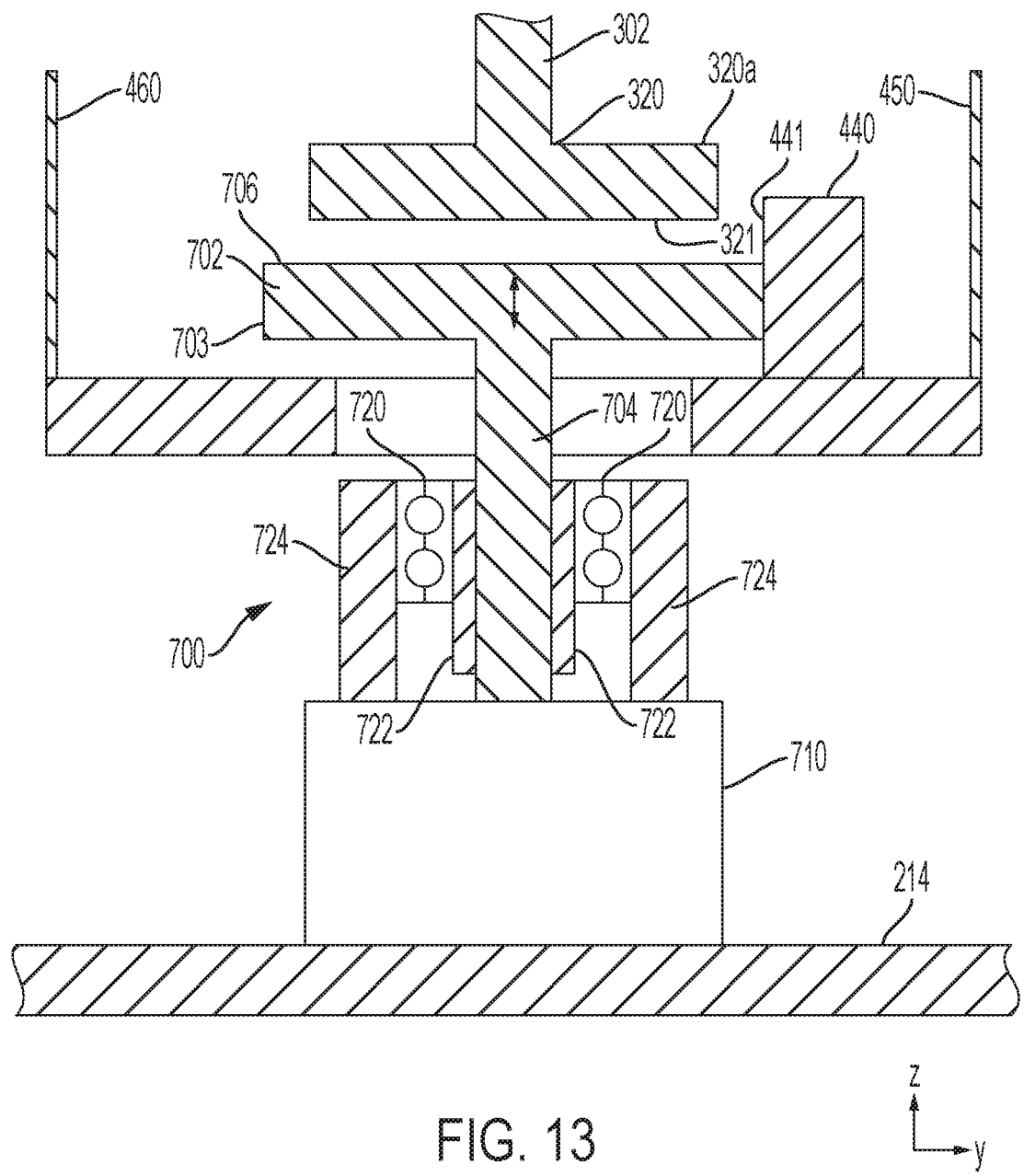
FIG. 13 depicts an embodiment of a clutch that is configured to engage and disengage power transmission from rotation of an output shaft of the drive device to rotation of a rotational member, and engage and disengage power transmission from the rotation of the output shaft of the drive device to a linear member engaged to the rotational member.

FIG. 13 depicts an embodiment of a clutch 700 that is configured to engage and disengage power transmission from rotation of the output shaft 302 of the drive device 300 to rotation of a rotational member 702, and engage and disengage power transmission from the rotation of the output shaft 302 of the drive device 300 to the linear member 440 engaged to the rotational member 702. Clutch 700 can be used with rotational member 702 configured as a gear having an outer circumferential surface 703 with teeth provided thereon, and a linear member 440 configured as a rack having a linear arrangement of teeth 441, as contemplated by the depiction in FIG. 13. Alternatively, clutch 700 could be used as a clutch with any of the other embodiments shown herein.

The clutch 700 includes a drive device 710 that is configured to drive a shaft 704 upon which the rotational member 702 is mounted in the Z direction. For example, the drive device 710 could be an air cylinder, solenoid, etc. that drives the shaft 704 in a linear direction and that passively allows rotation of the shaft 704, so that the rotational member 702 can be driven in rotation by the drive device 300 when the rotational member 702 is engaged to the output shaft 302. The lower end 320 of the output shaft 302 has a disk 320a with a lower engagement surface 321. When the drive device 710 is actuated to drive the shaft 704 in the Z direction, then an upper engagement surface 706 of the rotational member 302 contacts and thus engages (e.g., frictionally, using grooves, teeth, etc.) the lower engagement surface 321, and once the drive device 710 is no longer actuated then the drive shaft 704 will move in the −Z direction and the rotational member 702 will disengage from the output shaft 302. It is noted that the amount of movement of the shaft 704 in order to perform this engagement can be small, and is exaggerated in FIG. 13 for purposes of illustration. During this Z direction movement, the teeth on the outer circumferential surface 703 can slide with respect to teeth 441, and the components can slide or flex (e.g., belt 344c, member 340d, arm member 342d) in relation to one another in the other embodiments in order to allow for this small relative movement.

In order to allow for the movement of the shaft 704, the shaft 704 can be rotationally mounted using bearing 720. An outer periphery of the bearing 720 can be rigidly mounted to the drive device 710 by mounting bracket 724 that is mounted to lower wall 214 as shown or can be rigidly mounted directly to the lower wall 214. An inner periphery of the bearing 720 is slidably engaged to slides 722 that are fixed to the shaft 704, in order to allow movement of the shaft 704 along the Z axis and also allow rotation of the shaft 704 about the Z axis.

Figure 14:
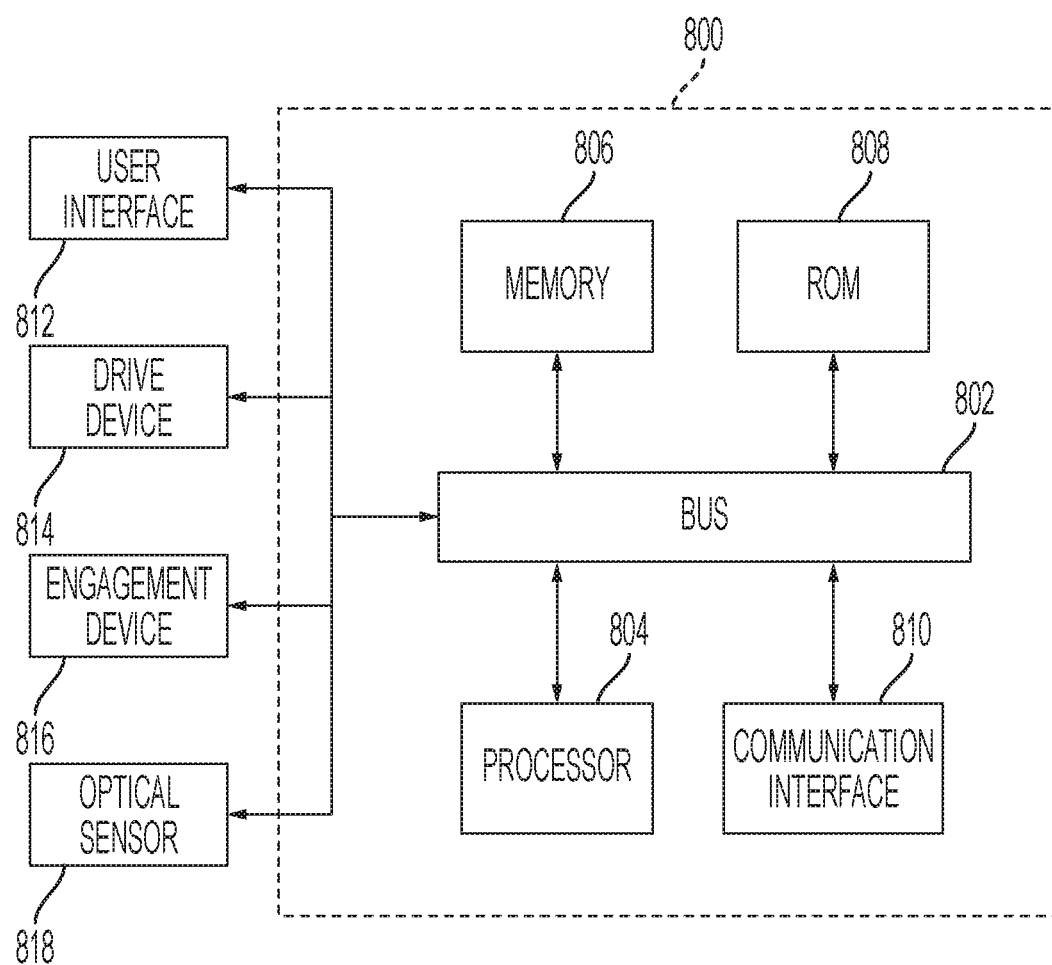
FIG. 14 is a schematic view of a computer with which an embodiment of a pre-alignment apparatus of the invention may be implemented.

FIG. 14 illustrates an embodiment of a computer 800 with which an embodiment of the invention may be implemented. Although computer 800 is depicted with respect to a particular device or equipment, it is contemplated that other devices or equipment (e.g., network elements, servers, etc.) within FIG. 14 can deploy the illustrated hardware and components of system 800. The computer 800 is programmed (e.g., via computer program code or instructions) to provide the functionality described herein and includes a communication mechanism such as a bus 802 for passing information between other internal and external components of the computer system 800. One or more processors 804 for processing information are coupled with the bus 802 to perform a set of operations on information as specified by computer program code.

The computer 800 also includes a memory 806 coupled to bus 810. The memory 806, such as a random access memory (RAM) or other dynamic storage device, stores information including processor instructions. The memory 806 is also used by the processor 804 to store temporary values during execution of processor instructions. The computer system 800 also includes a read only memory (ROM) 808 or other static storage device coupled to the bus 802 for storing static information, including instructions, that is not changed by the computer system 800. The computer 800 includes a communication interface 810 that allows the computer 800 to communicate with other devices or equipment (e.g., network elements, servers, etc.)

Information, including user input instructions, is provided to the bus 802 for use by the processor 804 from a user interface 812, such as a keyboard containing alphanumeric keys operated by a human user, a display device, a pointing device (such as a mouse or a trackball or cursor direction keys).

A drive device 814 (e.g., drive device 300) can communicate with the processor 804 via the bus 802 in order to send and receive data, operating instructions/commands, or other information therebetween. The processor 804 can control operation of the drive device 814 using operating instructions/commands in order to control rotation (e.g., start, stop, direction (e.g., clockwise, counterclockwise), speed, etc.) of an output shaft (such as output shaft 302) of the drive device 814.

An engagement device 816 (e.g. actuator 602, clutch 323c, clutch 323d, clutch 323e, etc.) can communicate with the processor 804 via the bus 802 in order to send and receive data, operating instructions/commands, or other information therebetween. The processor 804 can control operation of the engagement device 816 using operating instructions/commands in order to control actuation of the engagement device 816.

An optical sensor 818 (e.g. optical sensor 404) can communicate with the processor 804 via the bus 802 in order to send and receive data, operating instructions/commands, or other information therebetween. The processor 804 can control operation of the optical sensor 818 using operating instructions/commands in order to control operation of the optical sensor 818 in conjunction with the operation of the drive device 814 and/or the engagement device 818.

For example, as noted above, a semiconductor wafer can be placed on a wafer receiving surface of a wafer platform, the processor 804 (either using instructions entered by a user via the user interface 812 or instructions stored in memory 806) sends a command to the engagement device 816 to actuate, the processor 804 (either using instructions entered by a user via the user interface 812 or instructions stored in memory 806) sends a command to the drive device 814 to rotate the output shaft in order to drive the optical sensor 818 in a direction along the X axis toward the axis of rotation, and the processor 804 (either using instructions entered by a user via the user interface 812 or instructions stored in memory 806) sends a command to the optical sensor 818 to detect the presence or absence of the semiconductor wafer. Once the optical sensor 818 detects the presence of an edge of the semiconductor wafer move within the sensing area and sends such data to the processor 804, then the processor 804 sends commands to the drive device 814 and/or the engagement device 816 to deactivate to stop the movement of the optical sensor 818 in the direction along the X axis toward the axis of rotation. Once the optical sensor 818 is at a desired position with respect to the semiconductor wafer on the wafer receiving surface, then the process 804 can perform alignment of the semiconductor wafer for inspection and/or for processing by using the drive device 814 to rotate the wafer and the optical sensor 818 to scan the wafer in the sensing area.

It should be noted that the exemplary embodiments depicted and described herein set forth the preferred embodiments of the present invention, and are not meant to limit the scope of the claims hereto in any way. Numerous modifications and variations of the present invention are possible in light of the above teachings. It is therefore to be understood that, within the scope of the appended claims, the invention may be practiced otherwise than as specifically described herein.

What is claimed is:

1. An apparatus comprising:
   a base;
   a drive device disposed on the base, the drive device having an output shaft with a wafer receiving surface, the drive device being configured to rotate the output shaft about an axis of rotation;
   a sensor unit disposed on the base, the sensor unit being configured to sense a wafer received on the wafer receiving surface; and
   an engagement device configured to engage and disengage a translational mechanism between the drive device and the sensor unit,
   wherein, when the engagement device engages the translational mechanism, rotation of the output shaft about the axis of rotation by the drive device changes a relative positional relationship between the sensor unit and the axis of rotation.

2. The apparatus according to claim 1, wherein, when the engagement device disengages the translational mechanism, rotation of the output shaft about the axis of rotation by the drive device does not change the relative positional relationship between the sensor unit and the axis of rotation.

3. The apparatus according to claim 1,
   wherein the translational mechanism includes:
      a rotational member coupled to the output shaft;
      a carriage slidably coupled the base, the sensor unit being mounted on the carriage; and
      a linear member connected to the carriage, and
   wherein an outer circumferential surface of the rotational member is engageable with the linear member upon actuation of the engagement device such that rotation of the rotational member moves the carriage in relation to the axis of rotation.

4. The apparatus according to claim 3, wherein the engagement device includes an actuator configured to move the linear member into contact with the outer circumferential surface to engage the linear member to the rotational member.

5. The apparatus according to claim 4, wherein the linear member is mounted to the carriage by flexure members such that actuation of the actuator bends the flexure members to move the linear member into contact with the outer circumferential surface to engage the linear member to the rotational member.

6. The apparatus according to claim 5, wherein the carriage, the linear member, and the flexure members form a four-bar linkage.

7. The apparatus according to claim 4,
   wherein the rotational member is a gear, and
   wherein the linear member is a rack having a linear arrangement of teeth, the gear being engageable with the teeth.

8. The apparatus according to claim 4,
   wherein the outer circumferential surface of the rotational member is frictionally engageable with a surface of the linear member.

9. The apparatus according to claim 1, further comprising a rotational member coupled to the output shaft,
   wherein the engagement device is a clutch configured to engage and disengage transmission of rotation of the output shaft to rotation of the rotational member,
   wherein the translational mechanism includes a carriage slidably coupled the base, the sensor unit being mounted on the carriage, and
   wherein the translational mechanism further includes a drive member connecting the rotational member to the carriage such that rotation of the rotational member moves the carriage in relation to the axis of rotation.

10. The apparatus according to claim 9,
    wherein the drive member is a linear member connected to the carriage, the linear member being engaged to an outer circumferential surface of the rotational member such that rotation of the rotational member moves the carriage in relation to the axis of rotation.

11. The apparatus according to claim 10,
    wherein the rotational member is a gear, and
    wherein the linear member is a rack having a linear arrangement of teeth, the gear being engaged to the teeth.

12. The apparatus according to claim 10,
    wherein the outer circumferential surface of the rotational member is frictionally engaged with a surface of the linear member.

13. The apparatus according to claim 9, wherein:
    the drive member is a belt and pulley arrangement, the belt being driven by the rotational member, and the belt being connected to the carriage;

the drive member is a linkage including an arm member having a first end pivotally connected to the rotational member and a second end pivotally connected to the carriage; or the drive member is a drive arm having a cam slot, and the carriage includes a cam follower disposed within the cam slot.

14. An apparatus comprising:
a base;
a drive device disposed on the base, the drive device having an output shaft with a wafer receiving surface, the drive device being configured to rotate the output shaft about an axis of rotation;
a sensor unit disposed on the base, the sensor unit being configured to sense a wafer received on the wafer receiving surface;
a carriage slidably coupled the base, the sensor unit being mounted on the carriage; and
an engagement device configured to engage and disengage a coupling between the drive device and the carriage,
wherein, when the engagement device engages the coupling, rotation of the output shaft about the axis of rotation by the drive device changes a relative positional relationship between the sensor unit and the axis of rotation.

15. The apparatus according to claim 14, wherein, when the engagement device disengages the coupling, rotation of the output shaft about the axis of rotation by the drive device does not change the relative positional relationship between the sensor unit and the axis of rotation.

16. The apparatus according to claim 14,
wherein the coupling includes:
a rotational member coupled to the output shaft, and
a linear member connected to the carriage, and
wherein an outer circumferential surface of the rotational member is engageable with the linear member upon actuation of the engagement device such that rotation of the rotational member moves the carriage in relation to the axis of rotation.

17. The apparatus according to claim 14,
wherein the coupling includes a rotational member coupled to the output shaft,
wherein the engagement device is a clutch configured to engage and disengage transmission of rotation of the output shaft to rotation of the rotational member, and
wherein the coupling further includes a drive member connecting the rotational member to the carriage such that rotation of the rotational member moves the carriage in relation to the axis of rotation.

18. A method comprising:
providing an apparatus comprising:
    a base;
    a drive device disposed on the base, the drive device having an output shaft with a wafer receiving surface, the drive device being configured to rotate the output shaft about an axis of rotation;
    a sensor unit disposed on the base, the sensor unit being configured to sense a wafer received on the wafer receiving surface, and
    an engagement device configured to engage and disengage a translational mechanism between the drive device and the sensor unit;
engaging the translational mechanism between the drive device and the sensor unit, and rotating the output shaft about the axis of rotation by the drive device to change a relative positional relationship between the sensor unit and the axis of rotation; and
disengaging the translational mechanism between the drive device and the sensor unit, and rotating the output shaft about the axis of rotation by the drive device to rotate the wafer on the wafer receiving surface.

19. The method according to claim 18, wherein, when the translational mechanism is disengaged, rotation of the output shaft about the axis of rotation by the drive device does not change the relative positional relationship between the sensor unit and the axis of rotation.

20. The method according to claim 18, further comprising:
using the sensor unit to sense alignment of the wafer when the translational mechanism is disengaged and the output shaft is rotated by the drive device.

* * * * *